(12) United States Patent
Laine et al.

(10) Patent No.: US 9,614,369 B2
(45) Date of Patent: Apr. 4, 2017

(54) ESD PROTECTION DEVICE

(71) Applicants: Jean Philippe Laine, Saint Lys (FR); Patrice Besse, Tournefeuille (FR)

(72) Inventors: Jean Philippe Laine, Saint Lys (FR); Patrice Besse, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/836,048

(22) Filed: Aug. 26, 2015

(65) Prior Publication Data
US 2016/0285261 A1  Sep. 29, 2016

(30) Foreign Application Priority Data

Mar. 26, 2015  (WO) ............... PCT/IB2015/000547

(51) Int. Cl.
H01L 21/8222 (2006.01)
H02H 9/04 (2006.01)
H01L 27/02 (2006.01)
H01L 29/10 (2006.01)

(52) U.S. Cl.
CPC ......... H02H 9/046 (2013.01); H01L 21/8222 (2013.01); H01L 27/0262 (2013.01); H01L 29/1095 (2013.01)

(58) Field of Classification Search
CPC ............ H01L 27/0248; H01L 29/0649; H01L 29/66393; H01L 29/7436; H01L 21/8222; H01L 27/0262; H01L 29/1095
See application file for complete search history.

(56) References Cited

U.S. PATENT DOCUMENTS

| | | | | |
|---|---|---|---|---|
| 5,834,826 A | * | 11/1998 | Menegoli | H01L 27/0248 257/355 |
| 7,171,135 B2 | * | 1/2007 | Nishizawa | H04N 1/0035 399/38 |
| 8,390,092 B2 | | 3/2013 | Gendron et al. | |
| 2012/0091503 A1 | * | 4/2012 | Su | H01L 27/0262 257/140 |
| 2012/0205714 A1 | * | 8/2012 | Salcedo | H01L 21/8222 257/140 |
| 2013/0032882 A1 | * | 2/2013 | Salcedo | H01L 27/0262 257/355 |
| 2013/0057991 A1 | * | 3/2013 | Chatty | H01L 29/7436 361/56 |
| 2013/0208385 A1 | * | 8/2013 | Salcedo | H01L 23/60 361/111 |
| 2013/0242448 A1 | * | 9/2013 | Salcedo | H01L 27/0259 361/111 |
| 2013/0285111 A1 | * | 10/2013 | Di Sarro | H01L 21/84 257/107 |
| 2014/0061716 A1 | * | 3/2014 | Zhan | H01L 29/87 257/110 |
| 2014/0225156 A1 | | 8/2014 | Zhan et al. | |

(Continued)

OTHER PUBLICATIONS

Hongwei, P. et al., "A Novel Latch-up Free SCR-LDMOS with High Holding Voltage for a Power-Rail ESD Clamp," Journal of Semiconductors, vol. 34, No. 1; Jan. 2013, 5 pages.

Primary Examiner — Fazli Erdem

(57) ABSTRACT

An electrostatic discharge (ESD) device is disclosed having two PNP transistors. During a high-voltage ESD event a parasitic NPN transistor couples to one of the two PNP transistors to provide ESD protection.

20 Claims, 7 Drawing Sheets

(56) References Cited

U.S. PATENT DOCUMENTS

| | | | | |
|---|---|---|---|---|
| 2014/0225228 A1* | 8/2014 | Salcedo | ............... | H01L 27/0921 |
| | | | | 257/575 |
| 2014/0291765 A1* | 10/2014 | Ouyang | .............. | H01L 27/0277 |
| | | | | 257/355 |
| 2015/0022921 A1* | 1/2015 | Vinson | ................ | H01L 29/7436 |
| | | | | 361/56 |
| 2015/0187749 A1* | 7/2015 | Dai | ..................... | H01L 29/7436 |
| | | | | 257/173 |
| 2015/0221629 A1* | 8/2015 | Besse | ................. | H01L 29/7436 |
| | | | | 257/140 |
| 2015/0311193 A1* | 10/2015 | Laine | ................. | H01L 27/0259 |
| | | | | 257/491 |

* cited by examiner

US 9,614,369 B2

ESD PROTECTION DEVICE

CROSS REFERENCE TO RELATED APPLICATION(S)

The present application claims priority to International Patent Application No. PCT/IB2015/000547, entitled "ESD PROTECTION DEVICE," filed on Mar. 26, 2015, the entirety of which is herein incorporated by reference.

FIELD OF USE

The present disclosure relates generally to semiconductor devices, and more specifically, to semiconductor devices providing protection from electrostatic discharge (ESD).

BACKGROUND

Modern integrated circuits (ICs) and electronic assemblies, and the devices therein, are at risk of damage due to electrostatic discharge (ESD) events. This is well known in the art. Accordingly, it is commonplace to provide an ESD protection clamp (voltage limiting device) across the terminals of such devices, IC's and electronic circuits or assemblies. For certain processing technologies, bipolar NPN-based ESD protection structures have proved to be very resistive during a mean negative transient current stress. In addition, during the time activation of NPN type ESD protection structure, and over voltage can be created which exceeds the voltage capability of the circuit to be protected. As used herein, the term integrated circuit and the abbreviation IC are intended to refer to any type of circuit or electronic assembly whether formed in a monolithic substrate or as individual elements or a combination thereof.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where.

DETAILED DESCRIPTION

An electrostatic discharge (ESD) device is disclosed having two PNP transistors. During a high-voltage ESD event a parasitic NPN transistor couples to one of the two PNP transistors to provide ESD protection. The use of the PNP transistors in the configured illustration result in a lower on-resistance than that other embodiments based upon n-type transistors.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors but persons of skill in the art will understand that other semiconductor materials may also be used. Additionally, various device types and/or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

ESD protection clamps are circuit elements used to protect integrated circuit (IC) devices from voltage and current spikes that may be associated with an electrostatic discharge. To protect an IC device, an ESD clamp is connected between an input or output terminal of the device and a ground or common terminal. During normal operation, the ESD clamp does not conduct. But when subjected to an excessive voltage, the ESD clamp becomes conductive, conducting current to ground and limiting voltage to desired safe level, thereby protecting the IC to which the ESD clamp is connected.

Generally, ESD clamps can be connected across any terminals of an IC that constitutes the electronic device to be protected. Accordingly, any reference herein to a particular input or output terminal of an IC is intended to include any and all other terminals of electronic circuits, not merely those used for input or output signals. The disclosed ESD layouts herein have two PNP transistors, one of which will couple to a parasitic NPN transistor during a high-voltage ESD event.

Figure 1:
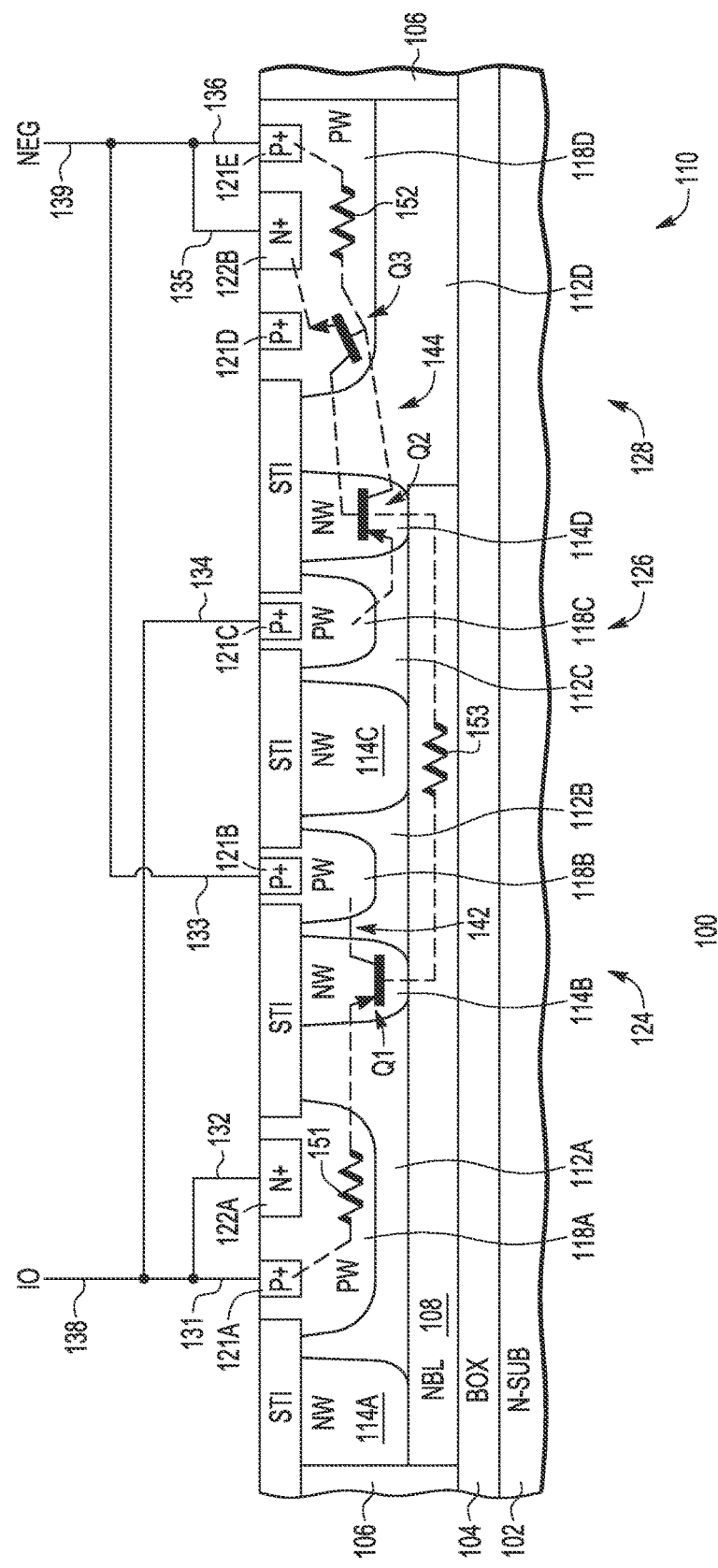
FIG. 1 is a cross-sectional view of an ESD protection device according to an embodiment of the present disclosure in a first operating condition implemented in a semiconductor substrate.
Figure 2:
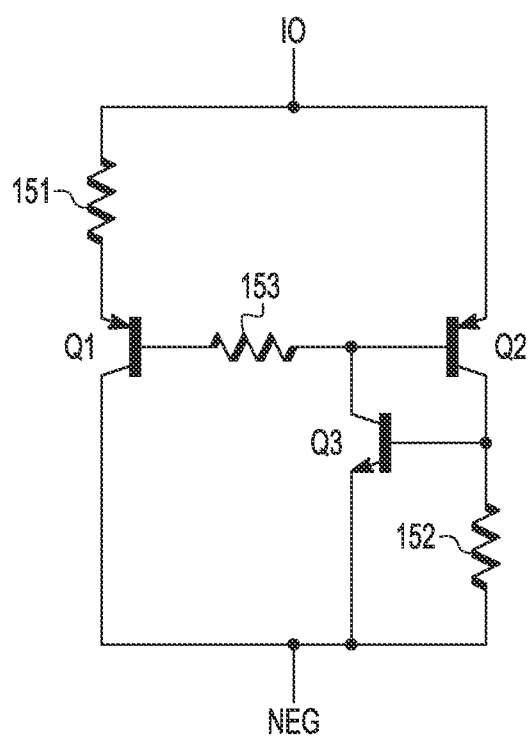
FIG. 2 is a schematic representation of the ESD protection device of FIG. 1.
Figure 3:
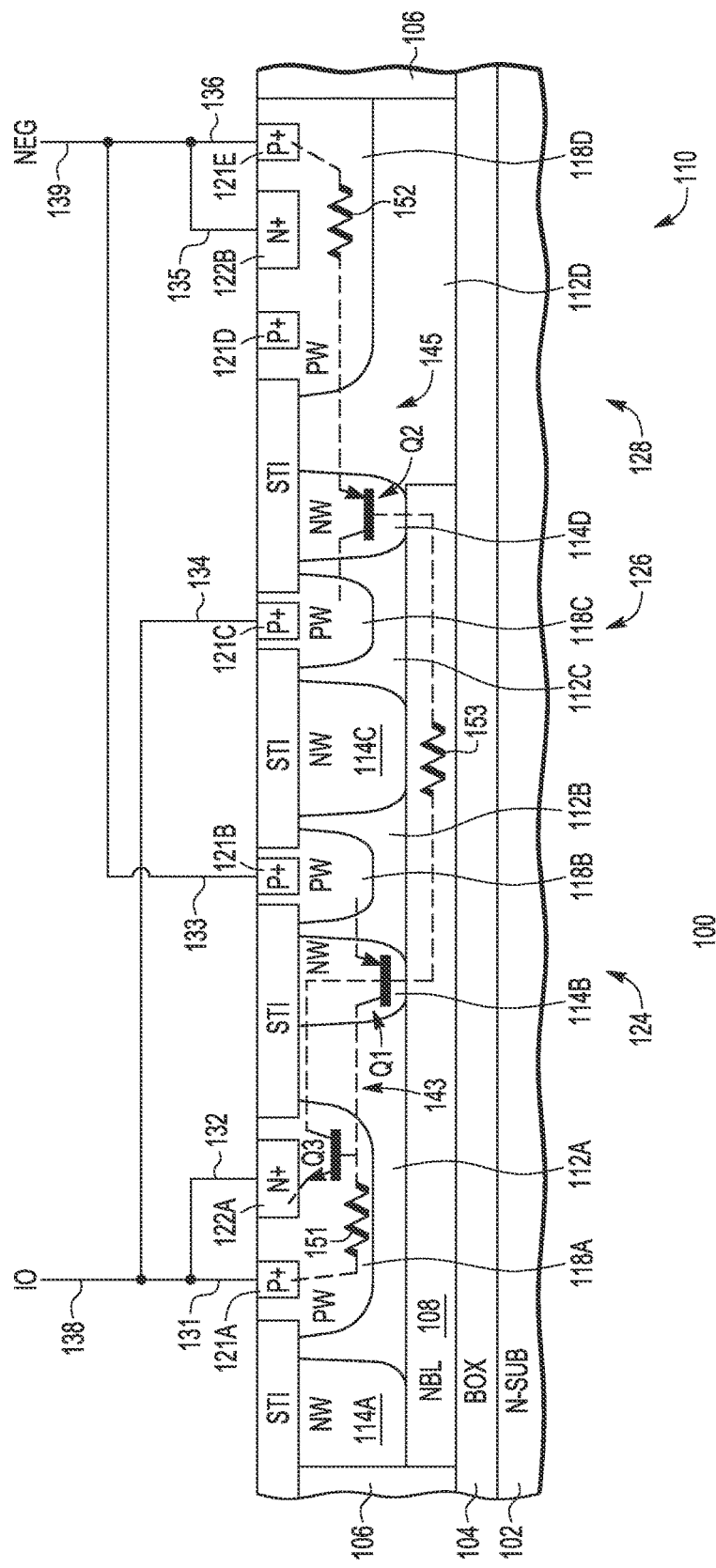
FIG. 3 is a cross-sectional view of the ESD protection device of FIG. 1 in a second operating condition.
Figure 4:
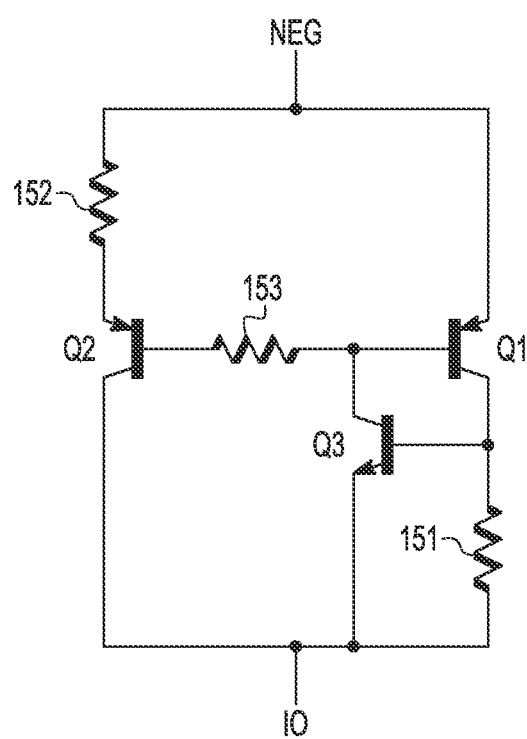
FIG. 4 is a schematic representation of the ESD protection device of FIG. 3.

FIGS. 1 and 3 illustrate a cross-sectional view of an ESD protection device 100 implemented in a semiconductor substrate according to an embodiment of the present invention under different operating conditions. FIGS. 2 and 4 illustrate corresponding circuit representations of the ESD protection device 100 as illustrated at FIGS. 1 and 3. ESD protection device 100 is a dual polarity (bi-directional) ESD clamp device for use in protecting electronic devices and circuits.

The ESD protection device 100 includes two PNP transistors 124 (Q1) and 126 (Q2) incorporated into an ESD protection clamp. The ESD protection device of FIG. 1 is in a forward breakdown state, e.g., the terminal 138 (IO) is at a sufficiently higher voltage than terminal 139 (NEG) to cause the ESD protection device to conduct current from the terminal 138 to the terminal 139. Conversely, the ESD protection device of FIG. 3 is in a reverse breakdown state, e.g., the terminal 139 (NEG) is at a sufficiently higher voltage than terminal 138 (IO) to cause the ESD protection device to conduct current from the terminal 139 to the terminal 138. As described below, the terms emitter and collector, and the terms anode and cathode refer to the state of the transistors 124 and 126 according to a referenced figure, as to the terms anode and cathode.

ESD protection device 100 is formed over substrate 102. The initial substrate 102 is provided with buried oxide layer (BOX) 104. Depending upon the implementation, substrate 102 may be either of N-type or P-type. Buried oxide layer 104 provides electrical isolation to devices formed over substrate 102. In a particular embodiment, the provided substrate includes a thin P-type epitaxial layer over the box layer. In some implementations of ESD protection device 100, however, BOX layer 104 may be excluded as discussed in greater detail herein.

As illustrated, a N-type buried layer (NBL) region 108 is formed over buried oxide layer 104. In one embodiment, the NBL layer can be formed over an existing semiconductor layer, such as a thin epitaxial layer mentioned above. In other embodiments an additional epitaxial layer, which may or may not be in situ doped, can be formed over the existing semiconductor layer. NBL 108 may be doped with antimony, phosphorus, or suitable combinations thereof. The peak doping density for NBL 108 is in the range of about $1 \times 10^{16}$ $cm^{-3}$ to about $1 \times 10^{19}$ $cm^{-3}$ and is typically at least as conductive as the N-Wells 114. NBL 108 may have a thickness (t) in the range of 1 micrometer (μm) to about 4 μm, and is located at a depth below the surface of ESD protection device 100 ranging from about 1.5 μm to 7 μm. But other dopants, concentrations, thicknesses and depths may also be used.

A portion of the NBL 108 is removed through an etch process. Therefore, as shown in FIG. 1, NBL 108 is not contiguous through ESD protection device 100. Instead, NBL 108, once formed, defines a portion or region 110, referred to as an "opening" unquote, wherein buried oxide layer 104 is exposed. As such, NBL region 108 does not form a continuous layer of N-type material formed across the surface of buried oxide layer 104. Consequently, as additional layers of material are formed over substrate 102, those layers of material may contact a surface of buried oxide layer 104.

NBL 108 can be formed using any suitable process. In one implementation, NBL region 108 is formed by an implantation process that relies upon a mask that causes regions 108 of NBL region 108 to be implanted, while at the same time defining opening 110 of NBL 108.

A region 112, also referred to as semiconductor layer 112, is formed over the entire device, including NBL 108 and the portion 110 with no NBL 108. For the portion 110 region 112 comes into contact with buried oxide layer 104. In the illustrated implementation, region 112 is formed by an P-type epitaxial deposition, and therefore can be referred to as an epi layer or an epi region. An example doping concentration range of region 112 is about $1 \times 10^{15}$ $cm^{-3}$ to about $8 \times 10^{15}$ $cm^{-3}$. As such, region 112 may be relatively lightly doped as compared to other regions. The depth of region 112 is usually in the range of 3 μm to about 9 μm in some embodiments.

A number of N-type well regions 114, also referred to as "N-wells", are formed within P-type epi region 112, also referred to as P-epi, including N-well regions 114A-114-D. Each of the N-well regions 114 extend to NBL 108, and therefore are electrically connected to NBL 108 and to each other. Formation of the N-well regions 114 partitions the P-EPI region 112 into individual P-type epi regions 112A-112D. P-EPI region 112A resides between N-well regions 114A and 114B; P-EPI region 112B resides between N-well region 114B and 114C; P-EPI region 112C resides between N-well region 114C and 114D; and P-EPI region 112D resides between N-well region 114D and the right-most isolation feature 106. N well regions 114 may be doped with arsenic, phosphorus, antimony, or suitable combinations thereof. The peak doping density for N-well regions 114 is usually in a range of about $1 \times 10^{17}$ $cm^{-3}$ to about $1 \times 10^{19}$ $cm^{-3}$ although other doping densities may also be used N-well regions.

A number of shallow trench isolation (STI) structures are formed over a surface of device 100. The depth of STI structures is usually in the range of about 0.05 μm to about 1 μm, more conveniently about 0.2 μm to about 0.5 μm, although thicker or thinner STI structures may also be used.

To fully isolate devices formed over substrate 102, deep trench isolation (DTI) regions 106 are formed to provide electrically insulating walls around the devices. DTI regions 106 include dielectric materials that provide lateral electrical isolation to the device. Deep trench isolation regions are provided extending from surface to buried oxide layer 104.

P-well regions 118 are formed within P-epi regions 112. In particular, P-well region 118A is formed within the P-EPI region 112A; P-well region 118B is formed within the P-EPI region 112B; P-well region 118C is formed within the P-EPI region 112C; and P-well region 118D is formed within the P-EPI region 112D. P-well regions 118 may be doped with boron or other suitable dopants. The peak doping density for P-well regions 118 is in the range of about $1 \times 10^{16}$ $cm^{-3}$ to about $1 \times 10^{19}$ $cm^{-3}$. The depth of P-well regions 118 may be in the range of 0.3 μm from the surface of device 100, to any location above or in contact with NBL 108, but other depth may also be used.

N+ doped contact regions 122A and 122B, also referred to as "N-contacts", are formed in P-well regions 118A and 118D, respectively. The N+ contact regions 122 include relatively shallow, but highly doped N-type regions and may include phosphorus, arsenic, or suitable combinations thereof as dopants. The peak doping density for N+ contact regions 122 can be in the range of about $5 \times 10^{19}$ $cm^{-3}$ to about $1 \times 10^{21}$ $cm^{-3}$. The depth of N+ contact regions 122 can range from about 0.05 μm to about 0.3 μm. Other dopants, density and depths, though, may also be used.

P+ doped contact regions 121, also referred to as "P-contacts", are formed in P-well regions 118A and 118D to make electrical contact with P-well regions 118A and 118D. P+ contact region 121A is in P-well region 118A; P+ contact region 121B is in P-well region 118B; P+ contact region 121C is in P-well region 118C; P+ contact regions 121D and 121E are in P-well region 118D, wherein an N+ contact region 122B is between P+ contact regions 121D and 121E. P+ contact regions 121 include relatively shallow, but highly doped P regions and may include boron as a dopant. The peak doping density for P+ contact regions 121 is in the range of about $5 \times 10^{19}$ $cm^{-3}$ to about $1 \times 10^{21}$ $cm^{-3}$. The depth of P+ contact regions 120 can range from about 0.05 μm to about 0.3 μm. But other dopants, density and depths may also be used.

In the configuration shown in FIG. 1, the terminal 138 is presumed to be at a higher voltage than the terminal 139, and therefore the ESD device FIG. 1 is experiencing a forward breakdown condition. The illustrated clamp includes PNP bipolar junction transistors 124 and 126. To illustrate the location and electrical interconnection of transistors 124 and 126 within the forward biased device, FIG. 1 includes a dashed schematic overlay showing the approximate location of transistor structures within device 100. In the overlay, transistor 124 is represented by transistor Q1 and transistor 126 is represented by transistor Q2. In FIG. 1, transistors Q1, Q2, Q3 (described below), and their interconnections are only included for reference and do not necessarily form any portion of the structure of device 100.

In FIG. 1, the base, emitter, and collector of transistor 124 correspond to N-well 114B, P-well 118A, and P-well 118B, respectively. A resistance of P-well region 118A is illustrated as resistor 151 connected in series between the emitter of Q1 and terminal 131 that is connected to a P-type contact region (P-contact) 121A. The base, emitter, and collector of transistor 126 correspond to N-well 114D, P-well 118C, and P-well 118D, respectively. A resistance of P-well region 118D is illustrated as resistor 152 connected in series between the collector of Q2 and terminal 136 that is connected to P-type contact region (P-contact) 121E. A resistance of the NBL 108 is illustrated as resistor 153 that is connected in series between the base of transistor Q1 and the base of transistor 128 The Cathode terminal 139 (NEG) includes terminal portion 136 that is connected to P-contact 121C, terminal portion 135 that is connected to N-contact 122B, and terminal portion 133 that is connected to the P-contact 121B of collector of transistor Q1 (P-well 118B). The anode terminal 138 includes terminal portion 131 that is connected to P-contact 121A, terminal portion 132 that is connected to in-contact 122A, terminal portion 134 that is connected to P-contact 121C of the emitter of transistor Q2 (P-well 118C).

In this configuration, a parasitic NPN transistor structure is formed in device 100 during avalanche breakdown at the approximate location of transistor Q3. The parasitic NPN transistor structure (Q3) includes a base at P-well 118D, an emitter at N-contact 122B, and a collector at N-well 114D. During the illustrated forward ESD event, the positive voltage applied to terminal IO causes the PN junction formed by the P-well 118C and the N-well 114D to act as a forward-biased diode allowing current to flow toward P-Epi region 112D.

Similarly, the positive voltage applied to terminal IO causes the PN junction formed by the P-well 118A and the N-well 114B to act as a forward-biased diode allowing current to flow toward P-Epi region 112B. The result is that the base-collector junction of transistor 126, which is formed by the N-Well region 114D and the P-Epi region 112D, and the base-collector junction of transistor 124, which is formed by the N-Well region 114B and the P-Epi region 112B, are both reversed biased.

When a sufficiently large voltage is applied to terminal IO, intermediate portion 144 of P-EPI region 112D, between the N-Well 114D and the P-Well 118D, becomes depleted of free carriers. Simultaneously, the sufficiently large voltage will cause intermediate portion 142 of P-EPI region 112B, between the N-Well 114B and the P-Well 118B, to also become depleted of free carriers. Note that the length of the intermediate portions 142 and 144 represent the base-collector spacings of transistor 124 and 126, and can be the same dimension to facilitate simultaneous breakdown.

As the applied voltage increases to Vt1, avalanche breakdown occurs across the base-collector spacing of both transistor 124 and 126. As the applied voltage increases above Vt1, the avalanche breakdown generates carriers turning on PNP transistors Q1 and Q2. As transistor Q1 turns on, electrons flow from the NEG terminal into the collector of transistor Q1 (P-Well 118B) and out of its emitter (P-Well region 118A) to the IO terminal at terminal portion 131 through resistor 151. Note that the resistance associated with resistor 151 is effectively inconsequential with respect to the forward breakdown mode of operation illustrated at FIG. 1.

As transistor Q2 turns on, current flows from the NEG terminal into the collector of transistor Q2 (P-well 118D) and out of its emitter (P-Well 118C) to the IO terminal at terminal portion 134. This current flow results in a voltage drop across resistor 152 (resistance of P-well 118 D) causes PNP transistor Q2 to couple with the parasitic NPN transistor 128 (Q3) so that the base of transistor Q2 (N-Well 114D) serves as, and connects to, the collector of transistor Q3 (P-epi 112D), which also serves as, and connects to, the base of transistor Q3. This coupling between transistor Q2 and transistor Q3 forms a parasitic silicon controlled rectifier (SCR) that connected between the anode terminal (IO) and the cathode terminal (NEG). In addition, because the bases of Q1 and Q2 are electrically connected through resistor 153, it is ensured that current will also flow through the transistor Q1 and its series resistor 151. The parasitic SCR effects provide strong current capability for the illustrated device after the device snaps back and begins conducting.

FIG. 3 illustrates the ESD protection device 100 in a reverse breakdown state caused by terminal 139 being at a sufficiently higher voltage than terminal 138 to cause the ESD protection device to conduct current from the terminal 139 to the NEG terminal 138. The reverse breakdown of the ESD protection device occurs in a similar manner as forward breakdown occurs, with transistor Q1 coupling with the parasitic transistor Q3'. FIG. 4 illustrates a circuit view of the device 100 during reverse breakdown.

Figure 5:
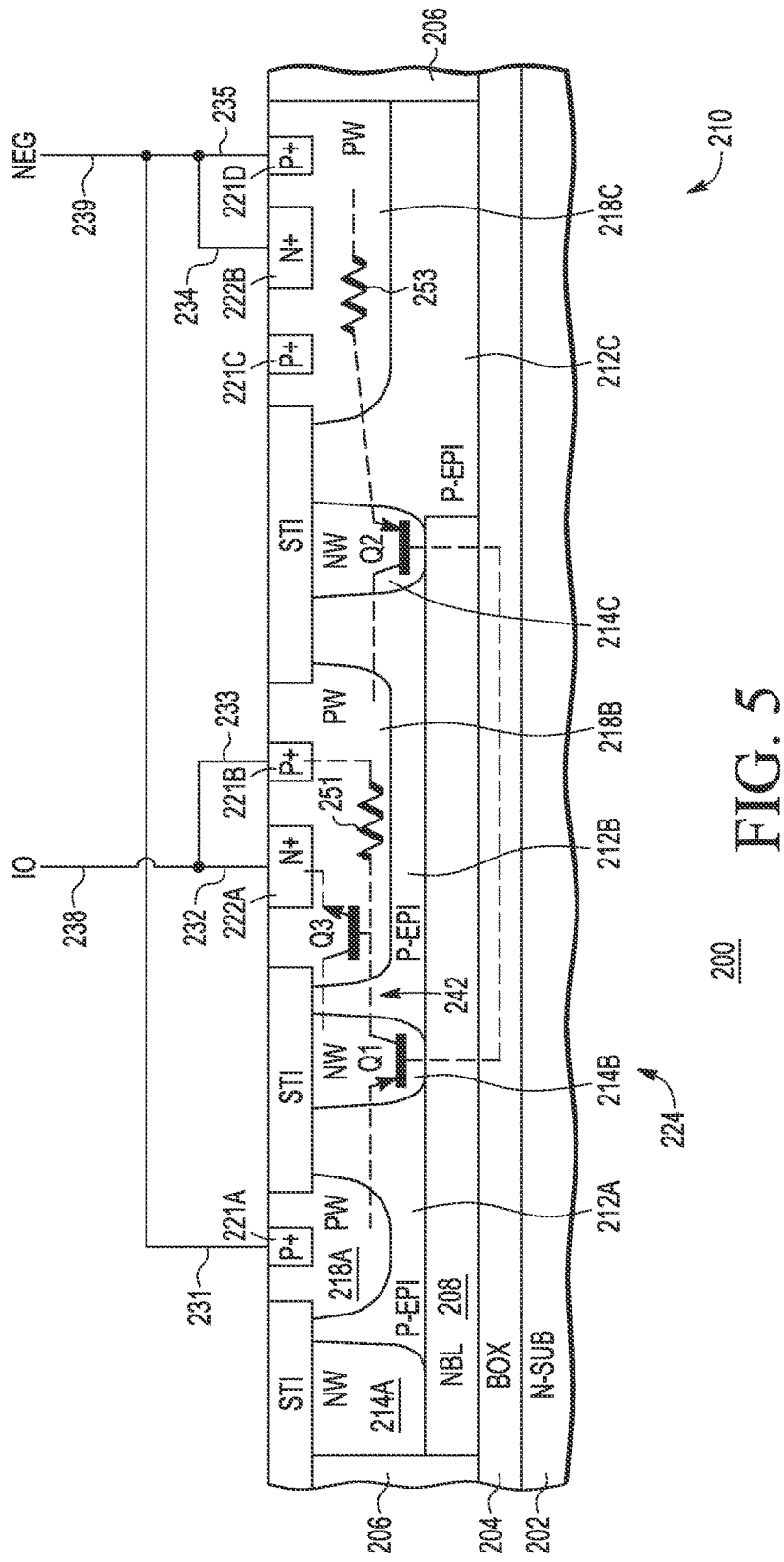
FIG. 5 is a cross-sectional view of a present ESD protection device according to an embodiment of the present disclosure in a first operating condition implemented in a semiconductor substrate.

FIG. 5 illustrates an embodiment of an ESD protection device 200 that avoids the use of a relatively high resistive diode of the prior art in the ESD current path from anode to collector. The ESD protection device 200 includes two PNP transistors 224 (Q1) and 226 (Q2) Incorporated into an ESD protection clamp. The ESD protection clamp of FIG. 5 is in a reverse breakdown state, e.g., the terminal 139 (NEG) is at a sufficiently higher voltage than terminal 138 (IO), causing the ESD protection device 200 to conduct current from the terminal 139 to the terminal 138 during an ESD event.

ESD protection device 200 is formed over substrate 202. The initial substrate 202 is provided with buried oxide layer (BOX) 204. Depending upon the implementation, substrate 202 may be either of N-type or P-type. Buried oxide layer 204 provides electrical isolation to devices formed over substrate 202. In some implementations of ESD protection device 200, however, BOX layer 204 may be excluded as us described in greater detail below. It will be appreciated, that the features of FIG. 5 that are similar to features of FIG. 1 can be formed using the techniques previously described.

A number of N-type well region's 214 are formed within P-epi region 212, including N-well region's 214 A-214 C. Each of the individual N-well regions 214 extend to NBL 208, and therefore are electrically connected to NBL 208 and to each other. Formation of the individual N-well regions 214 partition the P-epi region 212 into individual P-type epi regions 212A-212C. P-epi region 212A resides between N-well region 214A and 214B; P-epi region 212B resides between and well region 214B and 214C; and P-EPI region 212C resides between N-well region 214C and the rightmost isolation feature 206. In addition, a number of shallow trench isolation structures are formed over a surface of device 200.

P-well regions 218 are formed within P-epi regions 212. In particular, P-well region 218A is formed within the P-EPI region 212B; P-well region 218B is formed within the P-EPI region 212B; and P-well region 218C is formed within the P-EPI region 212C.

N+ doped contact regions 222A and 222B are formed in P-well regions 218B and 218C, respectively. P-contact 221A is formed in P-well region 218A. P-contact 221B is formed in P-well region 218B. P-contacts 221C and 221D are formed in P-well 218C.

In the configuration shown in FIG. 5, the terminal 239 is presumed to be at a higher voltage than the terminal 238, and therefore the ESD device FIG. 5 is experiencing a reverse ESD event. The illustrated clamp includes PNP bipolar junction transistors 224 and 226. To illustrate the location and electrical interconnection of transistors 224 and 226 within the forward biased device, FIG. 5 includes a dashed schematic overlay showing the approximate location of transistor structures within device 100. In the overlay, transistor 224 is represented by transistor Q1 and transistor 226 is represented by transistor Q2. In FIG. 1, transistors Q1, Q2, Q3 (described below), and their interconnections are only included for reference and do not necessarily form any portion of the structure of device 200.

In FIG. 5, the base, emitter, and collector of transistor 224 (Q1) correspond to N-well 214B, P-well 218A, and P-well 218B, respectively. A resistance of P-well region 218B is illustrated as resistor 251 connected in series between the collector of Q1 and terminal 233 that is connected to a P-contact 221 B. The base, emitter, and collector of transistor 226 (Q2) correspond to N-well 214C, P-well 218C, and P-well 218B, respectively. The cathode terminal 239 (NEG) includes terminal portion 235 that is connected to P-contact 221D, terminal portion 234 that is connected to N-contact 222B, and to terminal portion 231 that is connected to the emitter of transistor Q1 (P-well 218A). The anode terminal 238 includes terminal portion 233 that is connected to P-contact 221 B, and terminal portion 232 that is connected to N-contact 222A.

In this configuration, a parasitic NPN transistor structure is formed in device 200 during avalanche breakdown at the approximate location of transistor Q3. In this condition, the P-well region 218B serves as the base of the transistor structure Q3 connected through resistor 251 to the P+ contact region 221B. N+ region 222A and N-well region 214B serve as the emitter and collector of parasitic transistor structure Q3, respectively.

Thus, the positive voltage applied to terminal NEG causes a PN junction to be is formed by the P-Well 218A and the N-Well region 214B that acts as a forward-biased diode allowing current to flow toward P-Epi region 212B. The result is that the base-collector junction of transistor Q1, which is formed by the N-Well region 214B and the P-Epi region 212B is reversed biased.

When a sufficiently large voltage is applied to terminal NEG with respect to terminal IO, intermediate portion 242 of P-EPI region 212B becomes depleted of free carriers, where the distance between the N-Well 214B and the P-Well 218B represents the base-collector spacing of transistor 224.

As the applied voltage increases to Vt1, avalanche breakdown occurs across the base-collector spacing of transistor 224. As the applied voltage increases above Vt1, the avalanche breakdown generates carriers turning on PNP transistor 224. In particular, current flows from the NEG terminal into the emitter of transistor Q1 (P-Well 218A) and out of its collector (P-Well region 218B) to the IO terminal through resistor 251, which causes a portion of the P-well 218B to be biased relative P+ contact region 221B, thus biasing the base-emitter junction of Q2 in a manner allowing parasitic transistor Q3 to occur.

This coupling between transistor Q1 and transistor Q3 forms a parasitic silicon controlled rectifier (SCR). The parasitic SCR effects provide strong current capability for the present device after the device snaps back and begins conducting. In addition, because significant current does not flow between terminal 234 and 235 to terminals 232 and 233, e.g., through Q2, during an ESD event, the turn-on voltage is reduced as opposed to the prior art transistor that does not have P-well 218A.

Though not explicitly illustrated, it will be appreciated that device 200 is a bidirectional, and that a high voltage ESD event occurring at terminal 238 will result in a similar operation as that described with reference to FIG. 5, with the parasitic NPN transistor Q3 having its base at P-well 218C, its emitter at N-contact 234, and its collector at N-Well 214C.

Although the present disclosure describes specific examples, embodiments, and the like, various modifications and changes can be made without departing from the scope of the present disclosure as set forth in the claims below.

Figure 6:
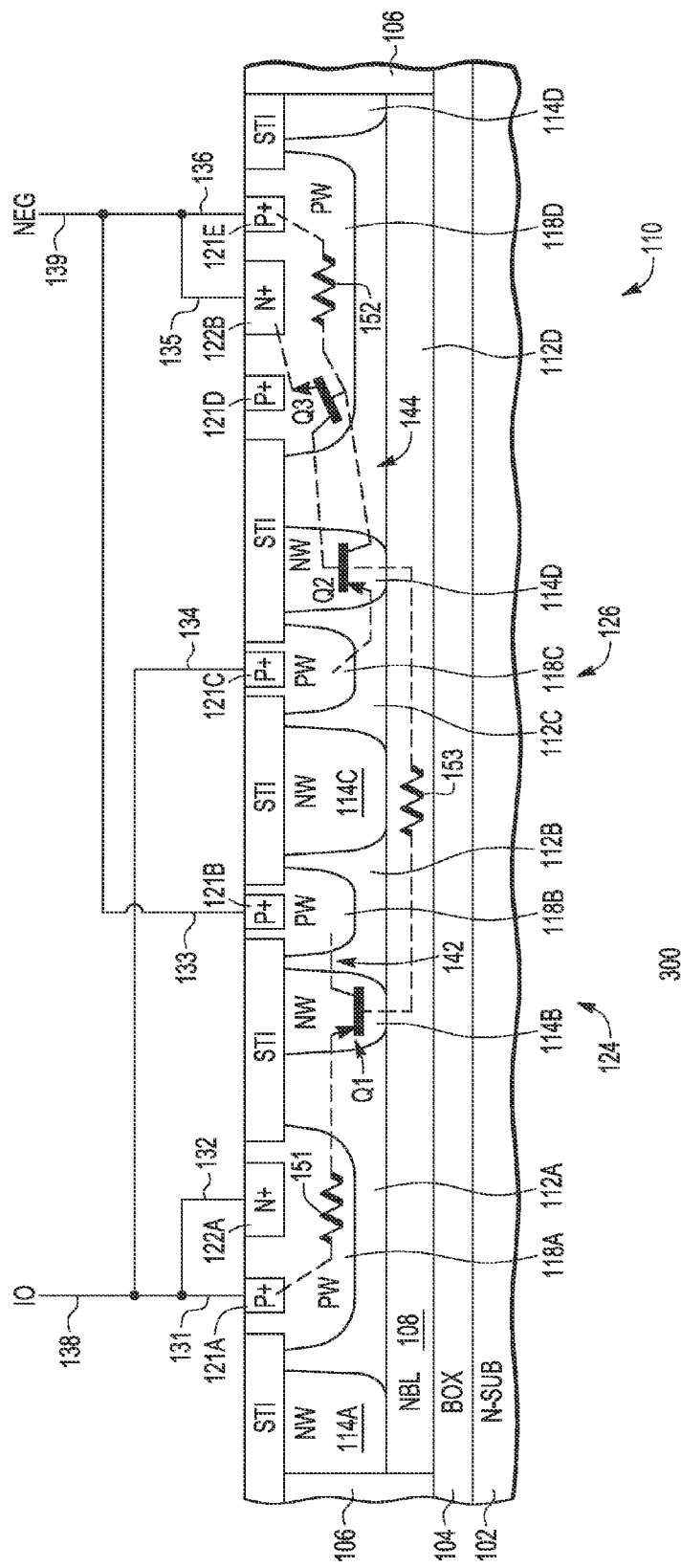
FIG. 6 is a cross-sectional view of an ESD protection device in accordance with a particular embodiment of the present disclosure.

For example, it will be appreciated that the disclosed ESD protection devices can be implemented with their respective NBL layers extended across the entire structure to an isolating deep N-Well, or highly doped P-type region. For example, FIG. 6 is the same basic ESD structure as device 100 of FIG. 6, which includes an extended NBL 108, and an additional N-well 114D in electrical contact with the extended NBL.

Figure 7:
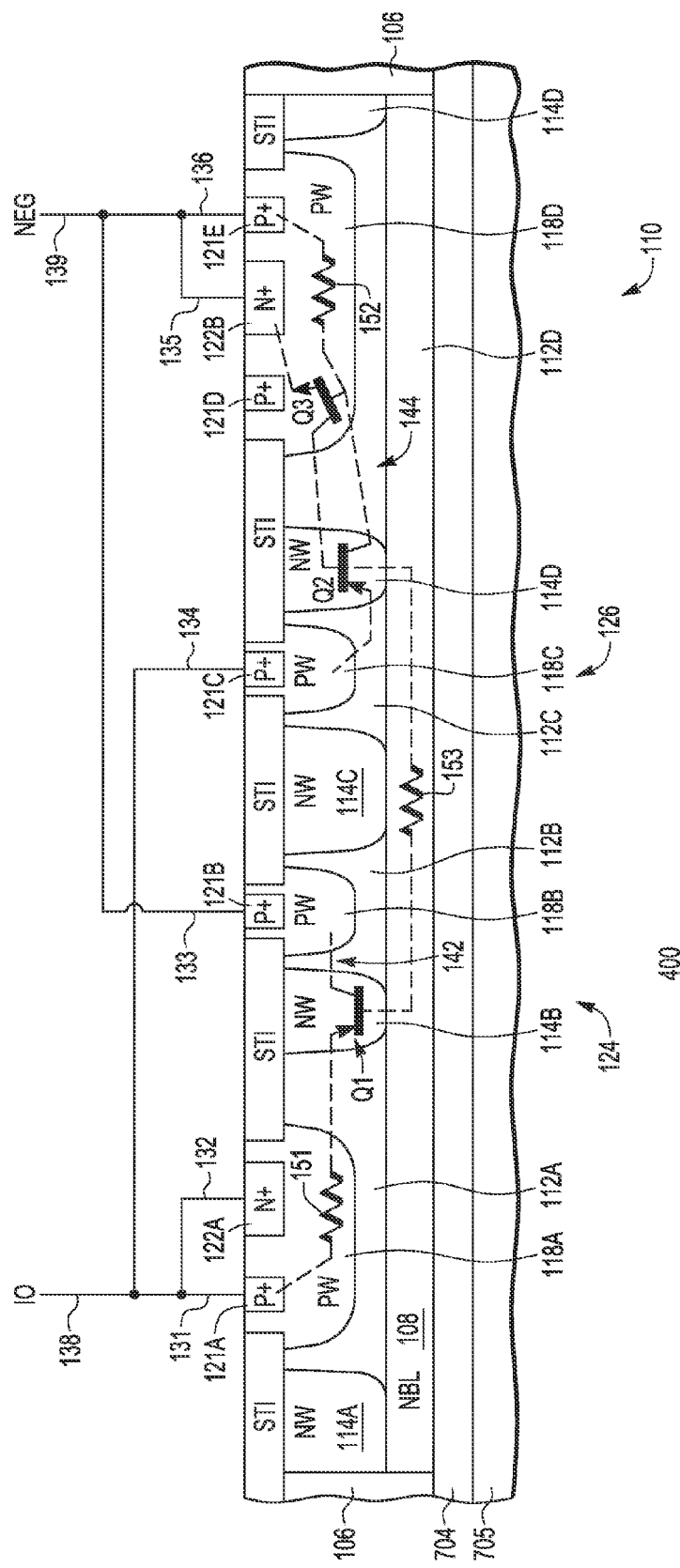
FIG. 7 is a cross-sectional view of an ESD protection device in accordance with a particular embodiment of the present disclosure.

In another embodiment, the disclosed ESD protection devices can be implemented on bulk semiconductor substrates. For example, FIG. 7 is the same basic ESD structure as device 100 of FIG. 6 after having been formed on a bulk substrate, instead of a semiconductor over insulator substrate. In particular, according to FIG. 7, the regions 704 and 705 represent one or more doped regions of the bulk substrate. For example, the substrate can be a heavily doped P-type substrate, wherein regions 704 and 705 have the same p-type substrate. In another embodiment, the regions 704 and 705 can be doped differently. For example, regions 704 can be a lightly doped P-type region and region 705 can be a heavily doped P-type region. can be a lightly or heavily doped P-type substrate, and layer 704 can be a lightly doped P-type substrate that is between the substrate region 705 and the NBL 108. In another embodiment (not illustrated), a N-well region large enough for the ESD device can be formed surrounded by a P-type substrate, with a bottom portion of the N-well region providing the interconnect feature of the NBL 108. Within the N-well region, and overlying the bottom-most portion of the N-well region, the various P-type regions described in reference to the above examples can be formed.

It will further be appreciated that the P-contact 121 B of devices 100 and 200 can be omitted, and that its presence can be used to optimize improve performance of the NPN transistor Q3, such as to adjust the snapback voltage of the device.

The previously detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. The term "electrically connected" as used herein with reference to two or more elements is intended to mean that a current flows between the devices and the referenced situation. As used herein the terms "substantial" and "substantially" mean sufficient to accomplish the stated purpose in a practical manner and that minor imperfections, if any, are not significant for the stated purpose.

Although the exemplary methods, devices, and systems described herein are in conjunction with a configuration for the aforementioned device, the skilled artisan will readily recognize that the exemplary methods, devices, and systems may be used in other methods, devices, and systems and may be configured to correspond to such other exemplary methods, devices, and systems as needed. Further, while at least one embodiment has been presented in the foregoing detailed description, many variations exist. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all of the claims.

What is claimed is:

1. A device comprising an electrostatic discharge protection clamp having an anode and a cathode each of which are adapted to limit a voltage appearing across protected terminals of an integrated circuit to which the electrostatic discharge protection clamp is coupled, comprising:
   an active semiconductor region overlying a substrate comprising
   a first P-well,
   a second P-well,
   a third P-well,
   a first N-well between the second and third P-wells and between the first and third P-wells,
   a second N-well between the first and second P-wells,
   a first P-type contact region at the first P-well electrically connected to an anode/cathode terminal of the electrostatic discharge protection clamp,
   a first N-type contact region at the first P-well electrically connected to the anode/cathode terminal,
   a second P-type contact region at the third P-well electrically connected to a cathode/anode of the electrostatic discharge protection clamp,
   a second N-type contact region at the third P-well electrically connected to the cathode/anode and between the first N-well and the second P-type contact.

2. The device of claim 1, wherein the second P-Well is connected to the cathode/anode terminal.

3. The device of claim 1 wherein the first P-Well is located between the second P-well and the first N-well.

4. The device of claim 3, wherein the second P well is electrically connected to the cathode/anode.

5. The device of claim 3, wherein the first N-type contact region is between the first P-type contact region and the second P-well.

6. The device of claim 1 wherein the second P-Well is located between the first P-well and the first N-well.

7. The device of claim 6, wherein the first N-type contact is between the first P-type contact and the second N-well.

8. The device of claim 7 further comprising;
   a fourth P-well between the second P-well and the first N-well; and
   a third N-well between the second P-well and the fourth P-well.

9. The device claim 8, wherein the fourth P-well is electrically connected to the anode/cathode.

10. The device of claim 1, wherein a buried N-type layer below the first, second, and third P-wells is electrically connected to the first and second N-wells.

11. A method of manufacturing an electrostatic discharge protection clamp adapted to limit a voltage appearing across protected terminals of an integrated circuit to which the electrostatic discharge protection clamp is coupled, comprising:
   providing a substrate comprising an active semiconductor region;
   forming a first P-well, a second P-well, and a third P-well;
   forming a second N-well between the first and second P-wells;
   forming a first P-type contact region at the first P-well;
   forming a first N-type contact region at the first P-well;
   forming a second P-type contact region at the third P-well;
   forming a second N-type contact region at the third P-well between the first N-well and the second P-type contact;
   forming an anode/cathode terminal electrically connected to the first P-contact and to the first N-contact; and
   forming a cathode/anode terminal electrically connected to the second P-contact and to the second N-contact.

12. The method of claim 11 wherein forming the cathode/anode further comprises forming the cathode/anode terminal electrically connected to the second P-well.

13. The method of claim 11 wherein the first P-well is located between the second P-well and the first N-well.

14. The method of claim 13, wherein the first N-type contact region is between the first P-type contact region and the second P-well.

15. The method of claim 11 wherein the second P-Well is located between the first P-well and the first N-well.

16. The method of claim 11, wherein the second P-well is located between the first P-well and the first N-well, and the first N-type contact is between the first P-type contact and the second N-well.

17. The method of claim 16 further comprising;
   forming a fourth P-well between the second P-well and the first N-well; and forming a third N-well between the second P-well and the fourth P-well.

18. The device claim 17, wherein the fourth P-well is electrically connected to the anode/cathode.

19. The device of claim 11, wherein a buried N-type layer below the first, second, and third P-wells is electrically connected to the first and second N-wells.

20. An electrostatic discharge protection clamp adapted to limit a voltage appearing across protected terminals of an integrated circuit to which the electrostatic discharge protection clamp is coupled, comprising:
   a substrate comprising a dielectric layer; and
   a first electrostatic discharge protection device including:
   a first PNP transistor at a first N-well of the integrated circuit, the first PNP transistor having a base region, a first current electrode region, and a second current electrode region;
   a second PNP transistor at a second N-well of the integrated circuit, the second PNP transistor having a base region, a first current electrode region, and a second current electrode region, wherein the second N-well is distinct from the first N-well; and
   a conductive buried layer formed over the substrate electrically connected to the base region of the first PNP transistor and to the base region of the second PNP transistor, wherein the second PNP transistor is distinct from the first PNP transistor.

* * * * *